United States Patent
Boas et al.

(10) Patent No.: US 6,350,964 B1
(45) Date of Patent: Feb. 26, 2002

(54) POWER DISTRIBUTION PRINTED CIRCUIT BOARD FOR A SEMICONDUCTOR PROCESSING SYSTEM

(75) Inventors: Ryan C. Boas; Paul J. Steffas, both of Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/710,518

(22) Filed: Nov. 9, 2000

(51) Int. Cl.[7] .................................................. F27B 5/14
(52) U.S. Cl. .................. 219/390; 219/405; 219/411; 118/724; 118/725; 392/416
(58) Field of Search ................................ 219/390, 405, 219/411; 118/724, 725, 50.1; 392/416, 418

(56) References Cited

U.S. PATENT DOCUMENTS

| 4,270,260 A | * | 6/1981 | Krueger .................... 219/403.4 |
| 5,155,336 A | | 10/1992 | Gronet et al. ................ 219/411 |
| 5,156,820 A | * | 10/1992 | Wong et al. ................. 118/724 |
| 5,607,609 A | * | 3/1997 | Sakuyama et al. .......... 219/388 |
| 5,624,590 A | * | 4/1997 | Fiory .......................... 219/390 |
| 5,755,511 A | | 5/1998 | Peuse et al. ................. 374/128 |
| 5,755,886 A | * | 5/1998 | Wang et al. ................. 118/715 |

* cited by examiner

Primary Examiner—Teresa Walberg
Assistant Examiner—Shawntina T. Fuqua
(74) Attorney, Agent, or Firm—Fish & Richardson (57) ABSTRACT

A semiconductor processing system including a printed circuit board structure for delivering power to an assembly of radiant energy sources. The printed circuit board structure, in one configuration, forms an evacuable housing for the assembly of radiant energy sources.

30 Claims, 10 Drawing Sheets

POWER DISTRIBUTION PRINTED CIRCUIT BOARD FOR A SEMICONDUCTOR PROCESSING SYSTEM

BACKGROUND OF THE INVENTION

This invention relates generally to a semiconductor processing system and, more specifically, to a semiconductor processing system having a processing chamber and a heat source assembly.

Rapid thermal processing (RTP) systems are employed in semiconductor chip fabrication to create, chemically alter or etch surface structures on semiconductor wafers. One such RTP system, as described in U.S. Pat. No. 5,155,336, includes a semiconductor processing chamber and a lamphead or heat source assembly located on the semiconductor processing chamber.

The semiconductor processing chamber may be fitted with a reduced pressure (RP) adapter plate for low pressure operation. The RP adapter plate includes a lower quartz window, an upper quartz window and a strengthening component, which is sandwiched between the lower and upper windows. The strengthening component may be made of stainless steel and comprise two spaced plates and a surrounding ring, which jointly define an enclosed volume. A plurality of tubes are welded into through holes in the plates to form light passageways.

A number of radiant heat sources, such as lamps, are located in the lamphead. The lamps are powered through a wiring collar, which is connected to a power supply controller by heavy-duty electrical cabling. The wiring collar includes numerous terminal block-to-lamp wires and lamp-to-lamp interconnect wires. Assembly and testing of the wiring collar and the lamphead cables can be expensive and time consuming.

During processing, radiation from the lamps radiates through the upper window, the light passageways and the lower window onto a wafer in the processing chamber. In this manner, the wafer is heated to a required processing temperature.

The pressure within the processing chamber, during processing, may be at a subatmospheric pressure. The reduced pressure within the processing chamber results in a negative pressure on the lower surface of the lower window. The pressure within the enclosed volume defined by the plates and the surrounding ring can be reduced to a pressure which is lower than, or near to, the pressure within the processing chamber in order to prevent collapse of the lower window. To this end, a port extends through the surrounding ring and is connected to a pump to reduce the pressure within the enclosed volume defined by the spaced plates and the ring.

SUMMARY OF THE INVENTION

In general, the invention is directed to a semiconductor processing system. In one aspect, the invention features an assembly of radiant energy sources having an upper surface and a lower surface. A window forms a seal with the lower surface of the assembly, and a printed circuit board structure forms a seal with the upper surface of the assembly. The printed circuit board structure is configured to distribute power to the radiant energy sources. The window and the printed circuit board structure form an evacuable enclosure including the assembly.

Particular implementations can include one or more of the following features. A base plate may be disposed between the printed circuit board structure and the upper surface of the assembly such that the window, base plate and printed circuit board structure form the evacuable enclosure that includes the assembly. A clamp ring can be used to secure the printed circuit board structure to the base plate. A plurality of o-ring seals can be used to maintain the vacuum integrity of the enclosure.

The printed circuit board structure can include a vacuum barrier layer, a base printed circuit board layer and a socket layer. The base printed circuit board layer has electrically-conductive traces and receptacles to distribute power to the radiant energy sources. The socket layer includes a plurality of receptacles configured to receive the radiant energy sources. The radiant energy sources have a flexible base which is received within one of the receptacles of the socket layer.

In yet another aspect, the invention features a system for use in semiconductor processing, including an assembly of radiant energy sources located within a housing having an upper surface and a lower surface. The printed circuit board structure forms a seal with the upper surface of the housing and distributes power to the radiant energy sources. A window forms a seal with the lower surface of the housing. A cover forms a seal with the printed circuit board structure. The housing, window, printed circuit board structure and cover form an evacable enclosure that encloses the radiant energy sources and a portion of the printed circuit board structure.

This system may further include an o-ring seal located between the cover and the printed circuit board structure.

In another aspect, the invention features an assembly of radiant energy sources located in a housing having an upper surface and a lower surface wherein a printed circuit board forms a seal with the upper surface of the housing. The printed circuit board is configured to distribute power to the radiant energy sources. The window forms a seal with the lower surface of the housing. The housing, window and printed circuit board form an evacuable enclosure.

The system may further include a socket layer having a plurality of receptacles configured to receive the radiant energy sources. The radiant energy sources can include a flexible base having a plurality of electrical connectors configured to receive power from the printed circuit board. Each electrical connector can be disposed within a plug of the flexible base and each socket layer receptacle can be configured to receive one of the plugs such that arcing is prevented. Each plug may have a circumferential notch configured to receive an o-ring to engage an interior surface of a socket layer receptacle. The plug may have a convex surface to engage the interior surface of the socket layer receptacle.

A base plate may be disposed between the printed circuit board and the upper surface of the assembly. A plurality of o-rings can be provided to maintain the vacuum integrity of the enclosure.

In still another aspect, the invention features a semiconductor processing system having a process chamber with a window and a support on which a substrate may be positioned during processing. The system further includes an assembly of radiant energy sources located on a side of the window opposite from that of the support to direct radiant energy through the window and onto a substrate on the support. The printed circuit board structure is located on a side of the radiant energy assembly opposite from that of the window to distribute power to the radiant energy sources. The window and the printed circuit structure are sealed to the radiant energy assembly such that the radiant energy assembly is evacuable to a pressure lower than or equal to a pressure in the process chamber.

In yet another aspect, the invention features a system for the thermal processing of a substrate. The system includes a process chamber having a window. The system also includes an assembly of radiant energy sources and reflectors disposed outside of the process chamber adjacent to the window to direct radiant energy through the window onto a substrate in the process chamber. The printed circuit board structure is located on a side of the assembly opposite from that of the window and is joined to an upper surface of the assembly to distribute power to the radiant energy sources.

The printed circuit board structure and the window can be sealed to the assembly to form an evacuable enclosure. Vacuum pumps may be used to evacuate the housing and the process chamber. The printed circuit board structure can include a vacuum barrier layer, a base printed circuit board layer and a socket layer.

In still another aspect, the invention features a printed circuit board structure for delivering power to an assembly of radiant energy sources of a semiconductor processing system. The printed circuit board structure includes a base printed circuit board layer having electrically-conductive receptacles configured to receive electrical connectors of the radiant energy sources and electrically-conductive traces to deliver power to the electrically-conductive receptacles.

Particular implementations can include one or more of the following features. The printed circuit board structure may include a socket layer having receptacles configured to receive base portions of the radiant energy sources. The socket layer is made of an electrically-insulating material. The base portions of the radiant energy sources are flexible and house a pair of electrical connectors each of which is configured to be received within a respective one of the base printed circuit board layer receptacles. The base portions of the radiant energy sources can include means for preventing arcing between the electrical connectors, and between the electrical connectors and ground. The arcing prevention means is positioned in the socket layer receptacles. The printed circuit board structure may also include a vacuum barrier layer.

Among the advantages of the invention are the following. The need for an RP adapter plate is eliminated, significantly reducing cost. Another benefit of removing the RP adapter is improved energy transfer from the lamphead to the process chamber.

The PCB structure serves two functions: power distribution and lamphead vacuum barrier. Using the PCB structure as part of a vacuum enclosure allows for a simple design. The PCB structure offers other advantages over current wiring collar designs including reductions in cost, size and complexity. The PCB structure is capable of distributing over 200 kilowatts(kw) of power to the lamphead assembly. The temperature of the PCB structure remains within safe material limits to prevent failure. Vacuum integrity is maintained, while minimizing the volume that needs to be evacuated. The main power cables for the lamphead assembly are external to the vacuum enclosure, eliminating the need for vacuum feedthroughs, and reducing outgassing problems and potential electrical arcing locations. Part cost, part count, assembly time, and test time are reduced.

Lamps having flexible bases are provided to accommodate imperfect alignment between lamp housing tubes and socket layer receptacles. The flexible base allows the lamp to be plugged directly into the PCB. A significant reduction in complexity results.

Other features and advantages of the invention will be apparent from the following detailed description, the accompanying drawings and the claims.

BRIEF DESCRIPTION OF THE DRAWINGS

The invention is further described by way of examples with reference to the accompanying drawings wherein.

DETAILED DESCRIPTION OF THE INVENTION

A semiconductor processing system including an evacuable lamphead or heat source assembly and a semiconductor processing chamber are described. In the following description, specific details are set forth in order to provide a thorough understanding of the invention. It will be appreciated, however, by one skilled in the art, that the invention may be practiced without these specific details. In other instances, well-known elements have not been shown in order to avoid unnecessarily obscuring the invention.

As shown in FIGS. 1A–3B, a semiconductor processing system 10 includes a semiconductor processing chamber 12, a substrate handling or support apparatus 14 located within the semiconductor processing chamber, and a lamphead or heat source assembly 16 located on the semiconductor processing chamber.

Figure 1A:
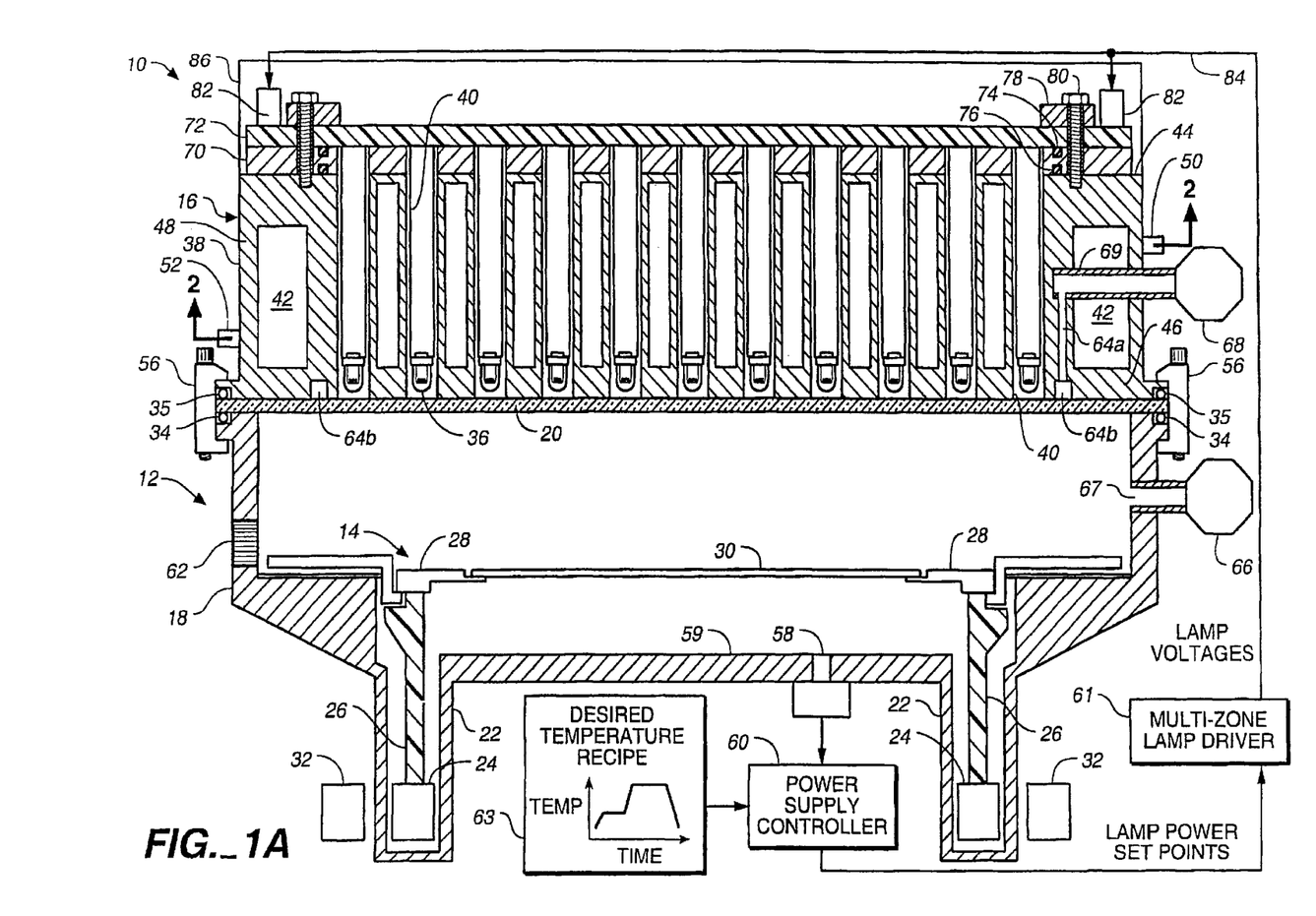
FIG. 1A is a schematic side view of a semiconductor processing system according to the invention.

The semiconductor processing chamber 12 includes a main body 18 and a window 20 resting on the main body 18. The window 20 is made of a material that is transparent to infrared light. For example, the window 20 may be made of clear fused silica quartz.

The main body 18 is made of stainless steel. Other suitable materials, such as aluminum, may also be used. A circular channel 22 forms part of a base of the main body.

The substrate handling apparatus 14 includes a magnetically-levitated rotor 24 within the channel 22, a silicon-coated quartz support cylinder 26 resting on or otherwise coupled to the magnetic rotor, and a silicon-coated silicon carbide edge ring 28 resting on the support cylinder. During processing, a substrate or wafer 30 rests on the edge ring.

A magnetic stator 32 is located externally of the channel 22 and is used to magnetically induce rotation of the rotor through the main body 18. Rotation of the rotor causes rotation of the support cylinder, edge ring and substrate. The substrate may be rotated between about 90 and 240 revolutions per minute(rpm).

The window 20 rests on an upper edge of the main body 18. An O-ring 34 is located between the window and the main body to provide a vacuum seal at the interface.

The lamphead assembly 16 overlies the window 20. An O-ring 35 is located between the window and the lamphead to provide a vacuum seal at that interface. The lamphead includes a plurality of lamps 36 that are housed within lamp housing tubes or light pipes 40.

Each light pipe 40 can include a reflective inner surface. The reflective surface is made of any suitable light reflecting material such as gold-plated aluminum. The open ends of the light pipes are located adjacent the window 20.

In one embodiment, the lamps 36 are radiation emitting light bulbs such as tungsten-halogen lamps. For processing a 300 mm (12 inch) wafer, for example, the lamphead assembly may include 409 lamps divided into 15 zones which are located in a radially symmetrical manner. The zones can be independently adjusted to allow the radiative heating of different areas of the substrate to be controlled. A lamphead assembly is disclosed in U.S. Pat. No. 5,155,336, assigned to the assignee of the present invention, the entire disclosure of which is incorporated herein by reference.

Figure 2:
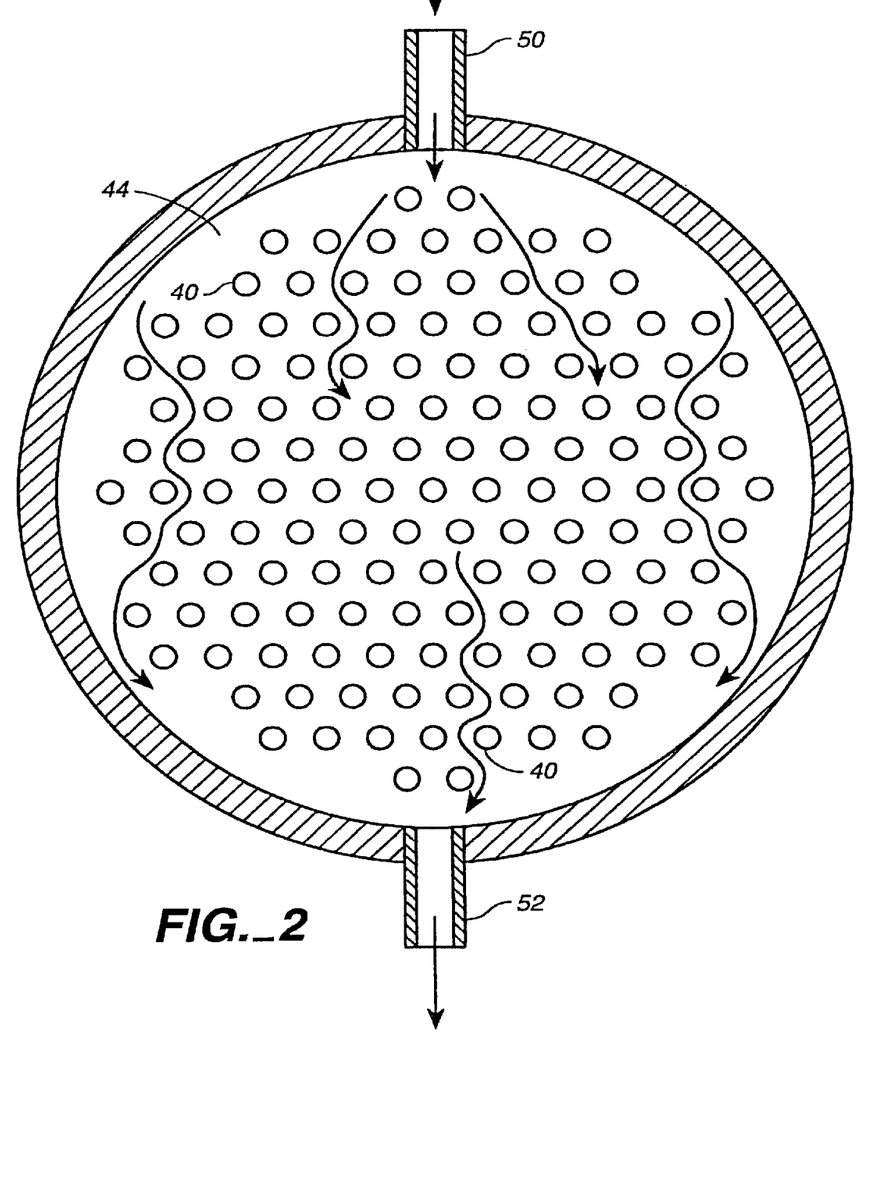
FIG. 2 is a sectional view of the semiconductor processing system taken along line 2—2 of FIG. 1.

The light pipes or reflectors may be part of a lamp housing 38 that comprises a honeycomb-like structure, the openings of which define the individual reflectors. A cooling chamber 42 is included within the lamp housing. The cooling chamber is defined by upper and lower chamber walls 44 and 46 of the lamp housing, respectively; the light pipes 40; and a cylindrical wall 48. A coolant, such as water, is introduced into the chamber via an inlet 50 and is removed at an outlet 52. Referring particularly to FIG. 2, the fluid travels in the space between the reflectors and serves to cool the lamps and reflectors. Baffles may be included to ensure proper flow of the coolant through the chamber.

A clamp or clamps 56 secure the window 20, the lamphead 16 and the process chamber 12 to one another. In other embodiments, other mechanisms are used such as bolts and the like.

Sensors, such as one or more pyrometers 58, are located in a reflective lower wall 59 of the main body 18 of the chamber and are positioned to detect a temperature at a backside of the wafer 30. Each pyrometer is connected to a multi-input, multi-output power supply controller 60, which controls the power supplied to each of the lamps 36 in response to a measured temperature.

For example, as noted, the lamphead assembly may include 409 tungsten-halogen lamps arranged in 15 different radial zones. The zones can be divided into seven control groups. Each control group is separately powered by a multi-zone lamp driver 61 that is, in turn, controlled by the power supply controller 60. During operation, a total of 200 kw of power may be distributed to the lamps of the lamphead assembly.

Since the substrate rotates between about 90 and 240 rpm and temperature measurements are made at different radial locations on the backside of the substrate, each temperature probe or sensor produces an average temperature over a different annular region of the substrate. The annular regions coincide with the lamp control groups. The controller 60 receives temperature measurements that are generated by the temperature sensors, corrects the temperatures based upon a temperature correction algorithm and adjusts the power level of the lamps to achieve a substrate temperature as specified by a pre-defined temperature cycle profile 63 that is supplied to the controller 60. Throughout the process cycle, the controller automatically adjusts the power levels delivered to the different control groups so that any temperature deviations away from the desired temperature profile may be corrected. Such a control system is described in U.S. Pat. No. 5,755,511, assigned to the assignee of the present invention, the entire disclosure of which is incorporated herein by reference.

The main body of the processing chamber 12 includes a processing gas inlet port 62 and a gas outlet port 67. In use, the pressure within the processing chamber may be reduced to a subatmospheric pressure prior to introducing a process gas through the inlet port 62. The process chamber pressure is maintained by pumping through the gas outlet port 67 by means of a vacuum pump 66. The pressure is typically reduced to between about 1 Torr and 160 Torr. Certain processes may be run at atmospheric pressure. The process chamber and lamphead will not need to be evacuated for these processes.

Another vacuum pump, vacuum pump 68, is provided to reduce the pressure within the lamphead assembly 16. The pressure within the lamphead assembly is reduced by pumping through a conduit or port 69, which is fluid communication with a channel 64a that extends into an annular groove 64b formed in the bottom surface of the lamp housing. The groove 64b, which extends around the lamp housing, is in fluid communication with the interiors of the light pipes by means of spaces and voids that are present in the lamphead assembly.

As shown in FIGS. 1A–1B and 3A–3B, the lamphead assembly 16 further includes a base plate 70 supporting a printed circuit board (PCB) structure or assembly 72. The base plate 70 and the PCB structure 72 form the upper surface of the lamphead assembly while the window 20 forms the lower surface of the lamphead assembly. An O-ring 74 is located between the base plate and the PCB to provide a vacuum seal at that interface. An O-ring 76 is located between the upper chamber wall 44 and the base plate 70 to provide a vacuum seal at that interface. The O-rings are located outside a circle containing the lamps 36.

The window 20, and O-ring seal 35 define the lower surface of the vacuum lamphead enclosure. The PCB structure 72, the base plate 70, and the O-ring seals 74 and 76 define the upper surface of the vacuum lamphead enclosure.

Figure 1B:
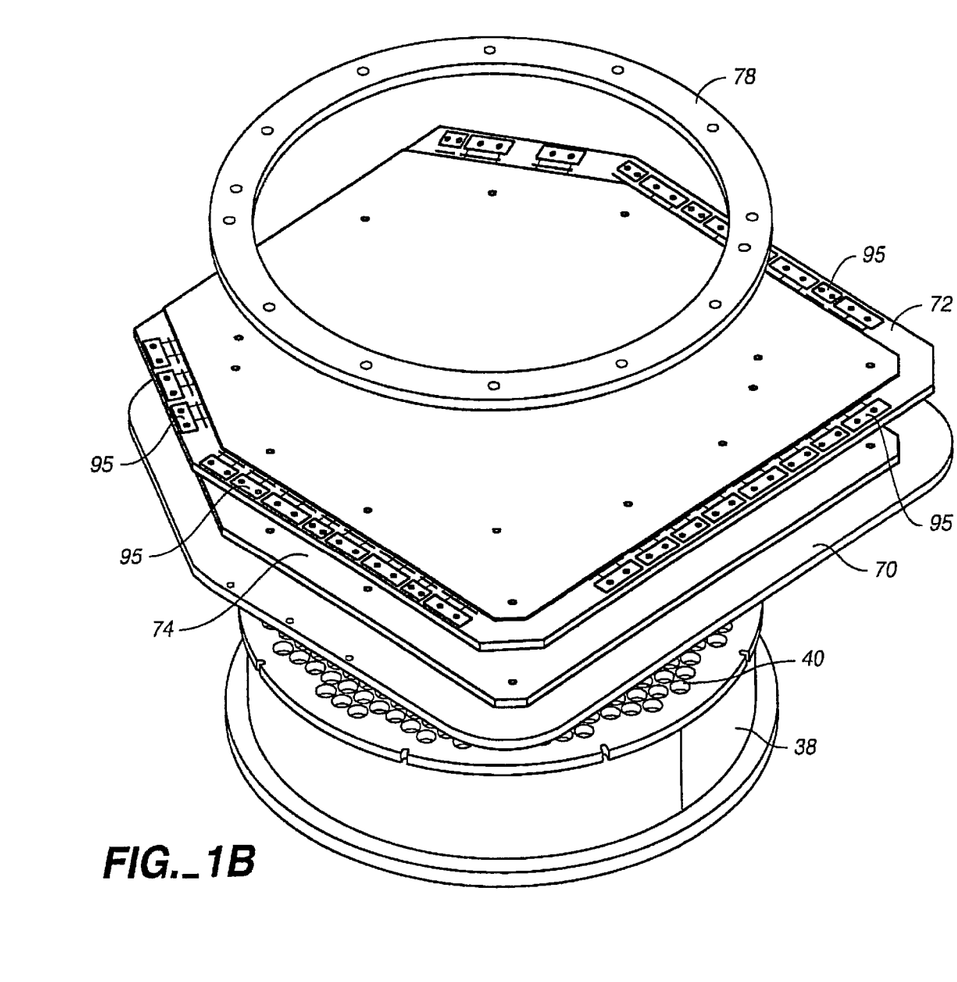
FIG. 1B is a schematic, exploded view of the lamphead assembly of FIG. 1A.
Figure 3A:
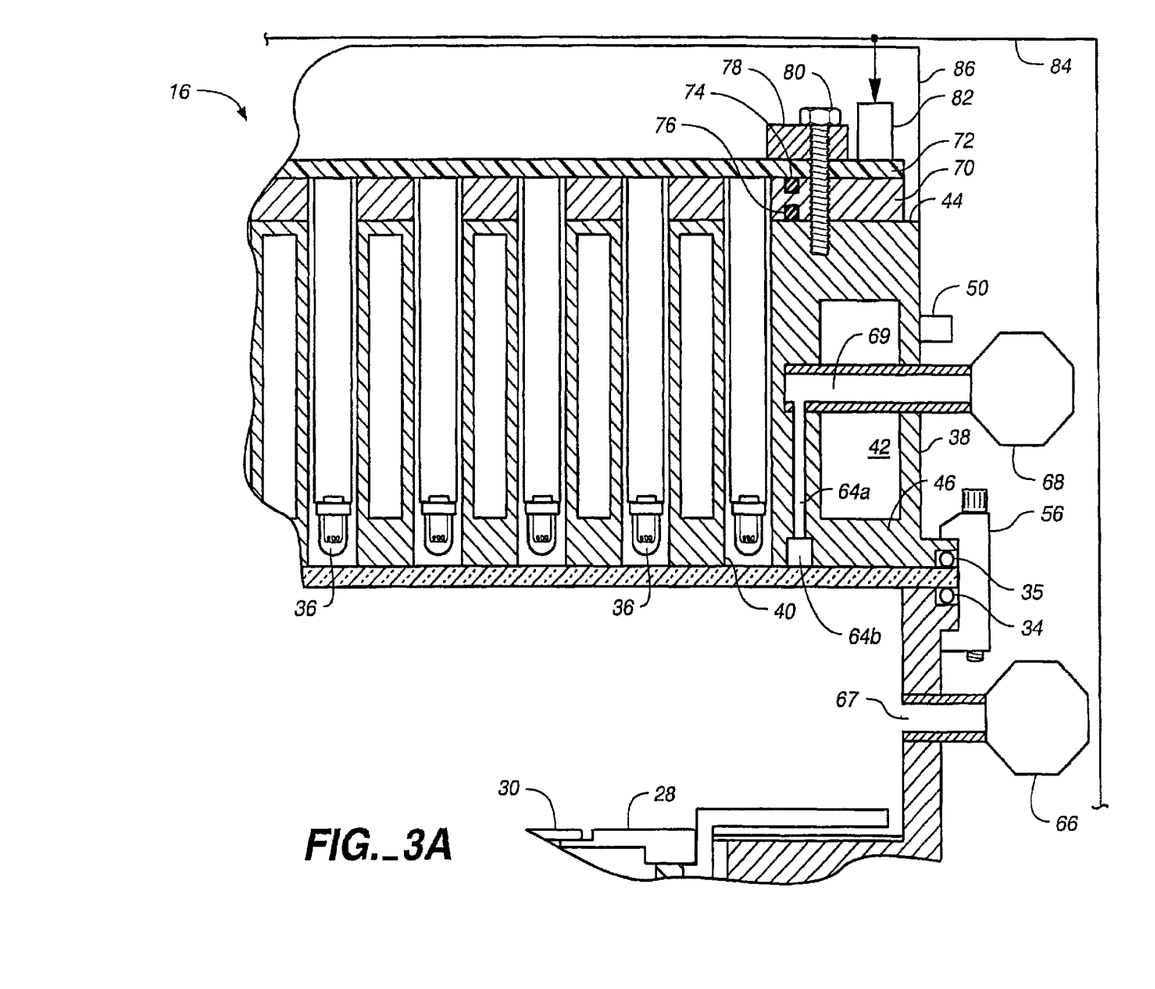
FIG. 3A is an enlarged view of a portion of the semiconductor processing system of FIG. 1A.

A clamp ring 78 secures the PCB structure 72 to the base plate 70. The clamp ring, as shown in FIGS. 1B and 3A, includes a plurality of bolts 80 arranged around a circle which is outside the circle defined by the O-ring seals 74 and 76. The bolts extend through openings in the clamp ring, the PCB structure and the base plate, and into threaded passageways in the upper chamber wall. The bolts maintain uniform compression of the O-rings 74 and 76. The clamp ring maintains proper seal compression during the initial vacuum pumpdown of the lamphead assembly as well as during chamber operation. A total of 12 bolts, for example, may be used. Other mechanisms, such as bolts with washers, may be used instead of the clamp ring.

A number of power supply terminal blocks 82 are located on the PCB structure. The terminal blocks are electrically connected, as described below, to terminal block pads and power distribution traces of the PCB structure. The terminal blocks are located outside the circle defined by the clamp ring 78. For the 15 zone lamphead described above, there are 30 power supply terminal blocks. The lamps of each zone, in one configuration, are connected in pairs. Thus, for a lamp zone having 30 lamps, for example, there are 15 traces from each of two terminal block pads, providing a supply and return for each lamp pair. There are also 15 lamp-to-lamp interconnect traces, one for each lamp pair.

Cables 84 connect the terminal blocks to the multi-zone lamp driver 61. The cables may extend through the top surface of a protective cover 86. The cover 86 covers all exposed electrical connections, protecting personnel from potential electrical shock.

The base plate 70 may be of aluminum. It is about 23 inches wide by 23 inches long, and it has a thickness of about one-half of an inch. The base plate, for a 409 lamp system, includes 409 holes through which the lamps extend into the light pipes 40 (See also FIG. 6). The base plate includes a circular groove on both its upper and lower surfaces for containing the o-ring seals 74 and 76, respectively. The base plate is bolted or otherwise secured to the upper surface 44 of the lamp housing 38.

The PCB structure 72 is capable of supporting a vacuum across its thickness within the area defined by O-ring seal 74. That is, leaks, virtual leaks and outgassing within this region must not produce an unacceptable rate of rise (pressure change versus time). The rate of rise should be less than ten Torr over ten hours.

The PCB structure can be made of a polyimide material, such as an 85 N polyimide available from Arlon, Inc., Materials For Electronics Division, Rancho Cucamonga, Calif. This material has a maximum service temperature of 260° C. Other suitable PCB materials, such as FR4 and super FR4, may be employed.

Figure 3B:
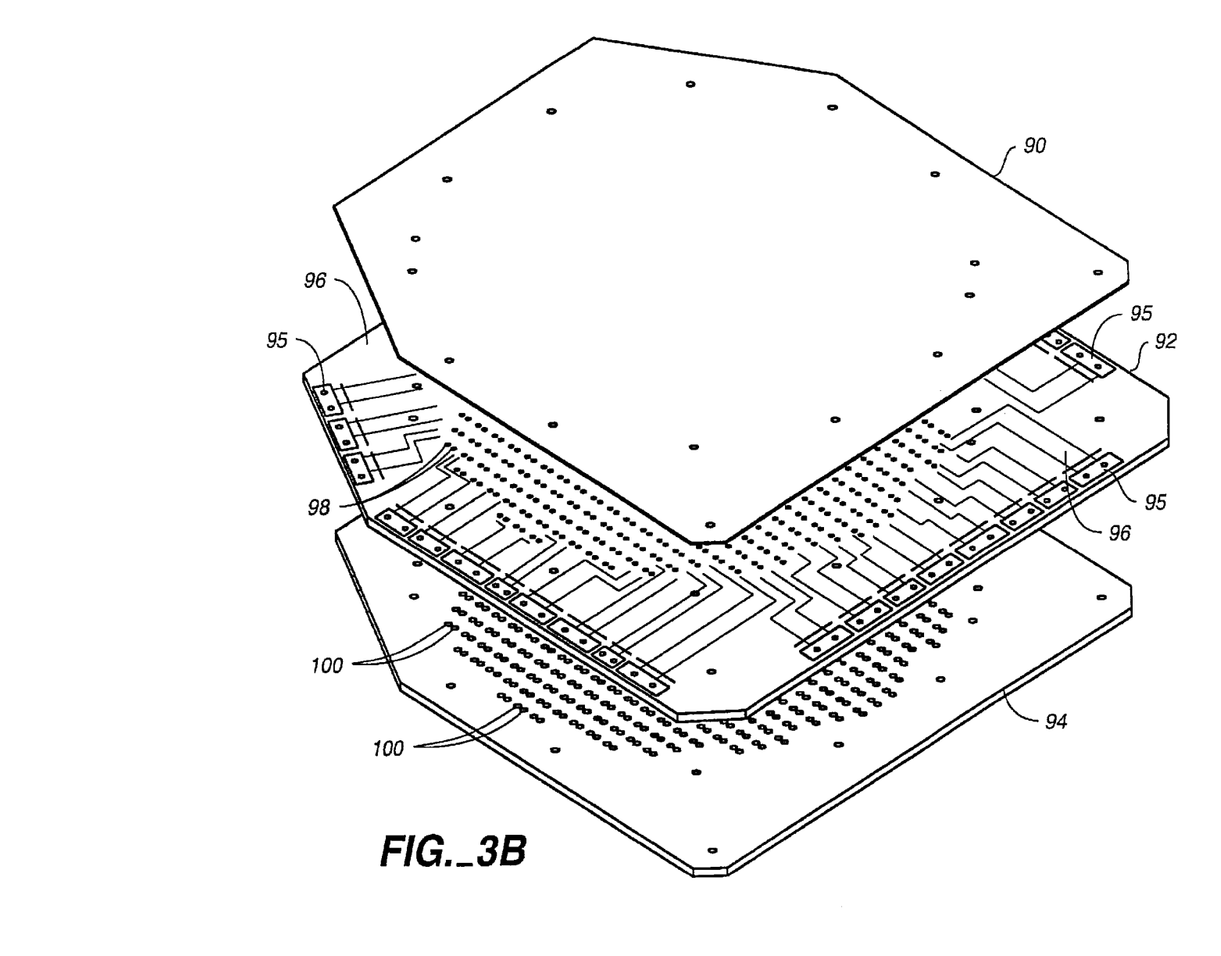
FIG. 3B is a schematic, exploded view of the printed circuit board assembly of the invention.

The PCB structure 72 includes three main layers: a vacuum barrier layer 90, a base PCB layer 92 and a socket layer 94 (See FIG. 3B). The three layers are laminated together, and they are constructed in accordance with well-known PCB fabrication techniques.

The vacuum barrier layer 90 prevents gas transport through the PCB structure. The vacuum barrier layer is about 20 inches long, 19 inches wide and 0.05 inches thick. There are no through holes in the vacuum barrier layer, except for those for the clamp ring bolts and for two alignment dowel pins. The vacuum barrier layer may be made of multiple layers of polyimide laminated together.

The base PCB layer 92 includes terminal block pads 95 and power distribution traces 96 for distributing power to the lamps. The base PCB layer, as discussed below, includes electrically-conductive receptacles 98 for receiving electrical connectors 36e of the lamps 36. For a 409 lamp system, for example, there are 818 receptacles formed in the base PCB layer, one receptacle for each of two lamp connectors (See FIGS. 4–6).

Each terminal block is electrically connected to one of the pads 95, and the traces 96 extend between the pads and the lamp pairs, both horizontally and vertically, to provide a supply, return, and interconnect for each lamp pair. The receptacles 98, as well as the traces, are made of any suitable electrically-conductive material such as copper. The receptacles are pressed into the base PCB layer.

Power dissipation within the PCB structure, and therefore heat generation, should be minimized to maximize the structure's life. As such, trace lengths should be minimized, while trace thickness and width, or trace cross-sectional area, should be maximized. (Trace resistance is directly proportional to trace length and inversely proportional to trace cross-sectional area). Potential "hot spots" in the base PCB layer, which can be caused by a relatively heavy concentration of traces in a particular area, should also be eliminated by maintaining uniform trace density.

A reduction in trace length can be achieved by optimizing the terminal block locations, reducing the structure's overall size and improving trace routing efficiency. Optimizing the location of the terminal blocks and providing a relative uniform distribution of traces will also reduce "hot spots".

The base PCB layer can be made of 12 laminated polyimide layers with traces in each layer. The base PCB layer is about 21.5 inches long, 21.7 inches wide and 0.24 inches thick. It is the only electrically-active layer of the PCB structure.

The socket layer 94 is made of an electrically-insulating material and includes a plurality of receptacle pairs 100, as also discussed below, each configured to receive a lamp base 36c (See FIGS. 4–6). The receptacles 100 are formed by drilling holes in the socket layer. The holes function as sealing sockets to prevent electrical arcing between the lamp connectors 36e and from lamp connectors 36e to ground.

The socket layer is about 20 inches long, 19 inches wide and 0.24 inches thick. The socket layer is made of the above-discussed polyimide material.

Figure 4:
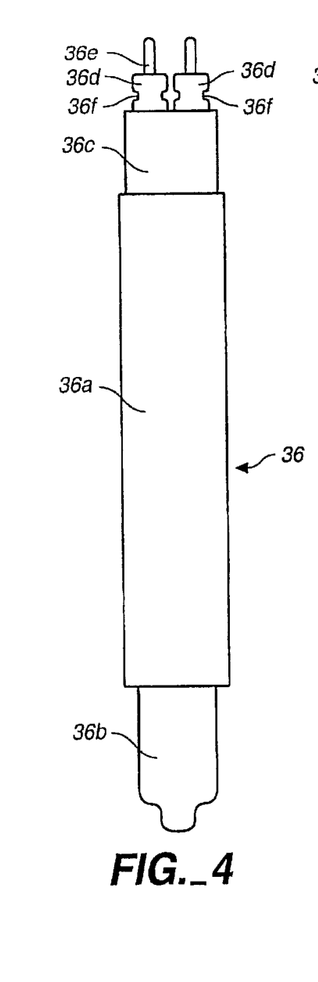
FIG. 4 is a schematic view of a lamp which may be used in the lamphead assembly of FIG. 1A.

As shown in FIG. 4, a lamp 36 includes a lamp body 36a, a lamp bulb 36b and a lamp base 36c. The lamp base includes a pair of plugs 36d. Each lamp plug houses an electrical connector 36e. Each plug 36d includes a circumferential notch 36f adapted to receive an o-ring to prevent arcing between the connectors, and between the connectors and ground. The o-ring 102 of each plug, as shown in FIG. 6, engages the inner surface of a receptacle 100 of the socket layer 94.

Figure 5:
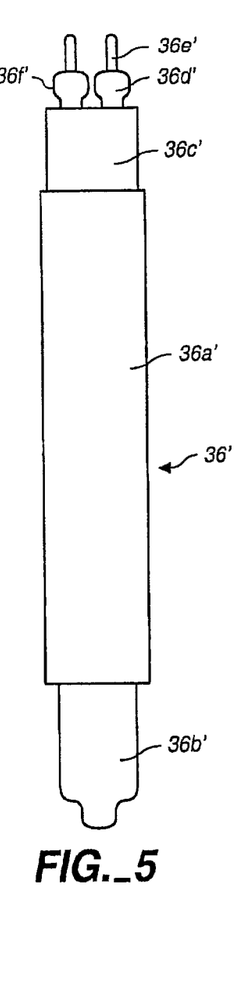
FIG. 5 is a schematic view of another lamp which may be used in the lamphead structure of FIG. 1A.

In another embodiment, as shown in FIG. 5, a lamp 36' includes a lamp body 36a', a lamp bulb 36b', a lamp base 36c', and a pair of plugs 36d', each housing an electrical connector 36e'. In this embodiment, the o-ring functionality is integrated directly into the plugs. Specifically, the plugs 36d' each have a convex surface 36f' that engages the inner surface of a receptacle 100 of the socket layer 94. Therefore, a separate o-ring is not needed for arc suppression.

The lamp bases 36c or 36c', which include plugs 36d or 36d', are flexible to accommodate imperfect alignment between the light pipes 40 and the socket layer receptacles. The flexible bases of the lamps allow the lamps to be plugged directly into the PCB assembly, replacing a currently-used floating socket design. A significant reduction in complexity results. In one embodiment, the lamp bases are formed from an elastomer material such as Santoprene 201-64 available from Advanced Elastomer Systems, L.P., Akron, Ohio.

Figure 6:
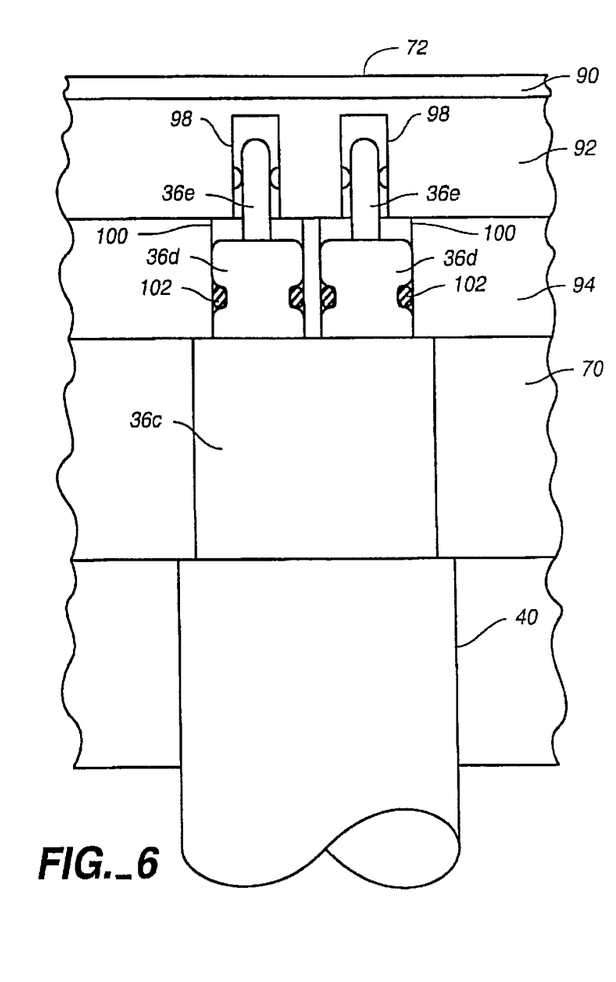
FIG. 6 is a schematic view of a lamp connected to the printed circuit board structure of the invention.

FIG. 6 depicts a lamp 36, like that shown in FIG. 4, mounted within the PCB structure 72, the base plate 70 and the light pipes 40. Each lamp electrical connector 36e sits within an electrically conductive receptacle 98 formed within the base PCB layer 92, thereby making electrical contact with the power distribution traces of the PCB base layer. The lamp plugs 36d of the lamp base 36c sit within a passage or receptacle 100 formed within the socket layer 94. Each plug is fitted with an o-ring 102 in the notch 36f, to prevent arcing between the electrical connectors, and between the electrical connectors and ground. A portion of each lamp base 36c sits within an appropriate opening formed in the base plate 70. The lamp body 36a and bulb 36b fit within a respective one of the light pipes 40.

Since the base plate 70 is adjacent the upper surface 44 of the lamp housing 38, it is indirectly cooled by the fluid in the cooling chamber 42. The PCB structure 72 is clamped against the base plate 70. During vacuum operation, the PCB structure is further forced against the base plate by the pressure differential between the ambient atmospheric pressure and the vacuum within the lamphead assembly. Thus, the PCB structure 72 is cooled by direct contact with the base plate 70. The PCB structure may also be cooled by conductive heat transfer through the lamp electrical connectors 36e. That is, heat is transferred from the PCB structure into each electrical connector at the end of each water-cooled lamp 36, creating an effective heat sink. A third method of PCB cooling is convective heat transfer between the PCB structure top surface and the surrounding environment. Both free and forced convection may be used.

Figure 7:
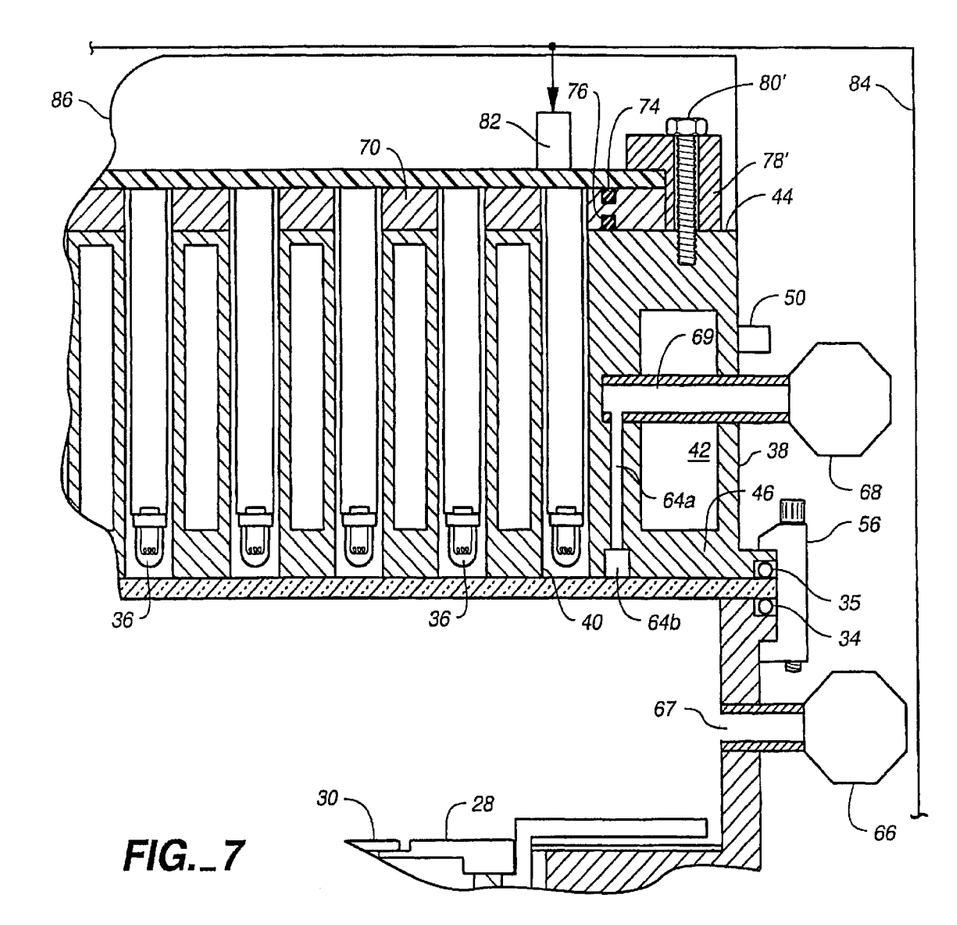
FIG. 7 is a schematic side view of a lamphead assembly having a perimeter-style clamp ring according to the invention.

As shown in FIG. 7, in another embodiment, a perimeter-style clamp ring 78' is used to secure the PCB structure 72 to the base plate 70 by bolts 80'. The bolts extend through openings in the clamp ring and the base plate, and into threaded passageways in the upper chamber wall to join the PCB structure and the base plate. A total of 12 bolts may be used. In this case, the terminal blocks 82 are located within the circle defined by the clamp ring. The terminal blocks, as shown, may be located within the circle defined by the o-ring seal 74, or they may be located outside this area (not shown).

Figure 8:
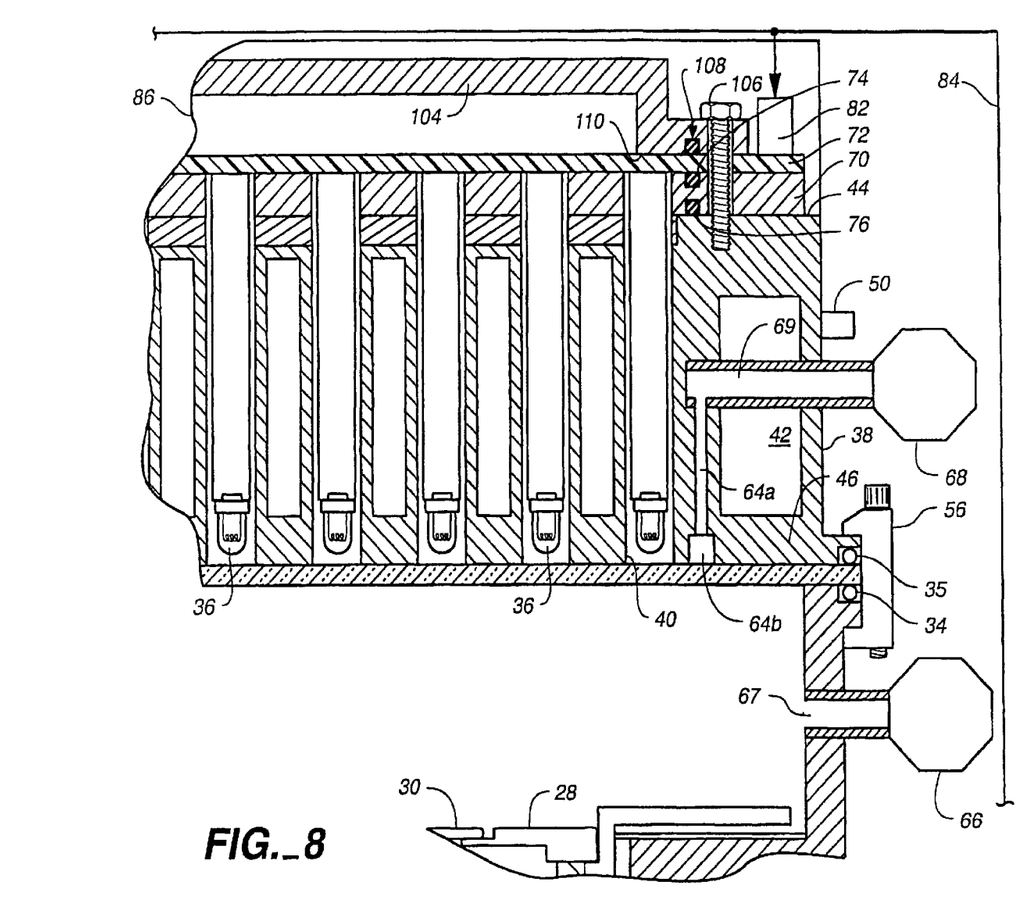
FIG. 8 is a schematic side view of a lamphead assembly having a vacuum chamber lid according to the invention.

As shown in FIG. 8, in yet another embodiment, the lamphead may include a vacuum chamber lid or cover 104 secured to the base plate 70 by, for example, bolts 106. The bolts 106 extend through openings in the chamber lid, the PCB structure and the base plate, and into threaded openings in the upper chamber wall. A total of 12 bolts may be used to secure the chamber lid, which can be made of aluminum, to the base plate. An O-ring 108 is located between a lower wall portion 110 of the chamber lid and the upper surface of the PCB structure 72 to provide a vacuum seal at that interface. A circular groove can be formed in the lower wall portion 110 to contain the o-ring.

The lower wall portion 110 of the vacuum chamber lid can also include grooves to facilitate evacuation of the area under the lid. In this case, the lid is a flat plate. The PCB structure would also have a through vent hole for improved pumping conductance.

This embodiment eliminates the need for vacuum integrity across the PCB structure thickness. Therefore, a vacuum barrier layer is not necessarily required. Vacuum integrity for the PCB structure need only be maintained at the interfaces defined by O-rings 74 and 108. However, a layer similar to a vacuum barrier layer could be used as an electrically-insulating layer for the PCB structure.

The terminal blocks 82, in this configuration, are located outside the vacuum enclosure. All lamp power is transmitted into the vacuum enclosure via the PCB traces which function like vacuum feedthroughs.

PCB cooling mechanisms for this embodiment are similar to those described above with the following differences. The proximity of the cover 104 to the top surface of the PCB structure can also be adjusted to improve PCB structure cooling. Pumping grooves in the cover allow direct contact between the lower surface of the cover and upper surface of the PCB structure. Both sides of the PCB structure are conductively cooled in this case. Direct contact between the cover and PCB structure improves cooling, through improved clamping, when the lamphead is not evacuated. The PCB structure is pressed against the base plate 70 in a more uniform manner. The PCB structure is also cooled indirectly by convective cooling of the cover. Both free and forced convection may be used.

During subatmospheric processing, the volume under the cover is evacuated. The cover exerts a downward force on the PCB structure and the base plate further improving thermal contact among the cover, the PCB structure and the base plate and therefore cooling.

Figure 9:
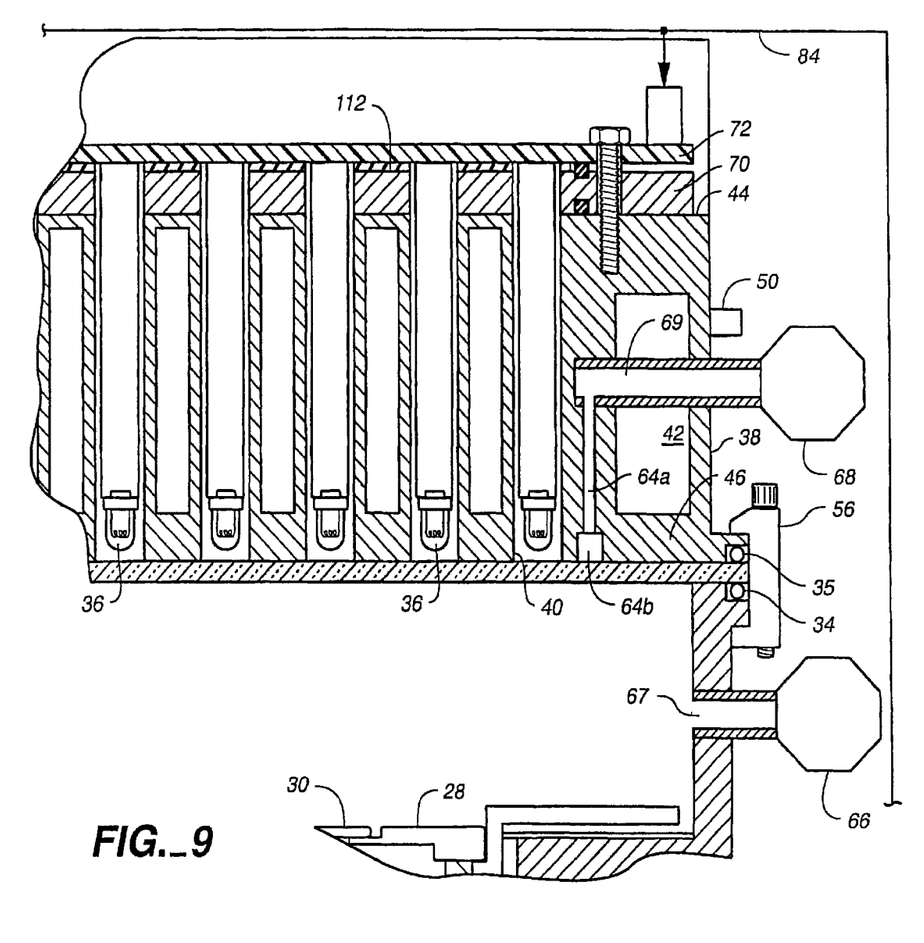
FIG. 9 is a schematic side view of a lamphead assembly having an electrically insulating layer according to the invention.

An electrically-insulating layer may be required between the base PCB layer 92 and the upper wall 44 of the lamp housing to prevent electrical arcing during vacuum operation. The electrically-insulating layer, which may be a plate made of polyimide, polycarbonate or other electrically-insulating material, may be provided as an additional layer on the PCB structure, integrated with the socket layer, or incorporated as a separate plate 112 as shown in FIG. 9. The plate would include openings through which the lamps of the lamphead assembly can extend.

Figure 10:
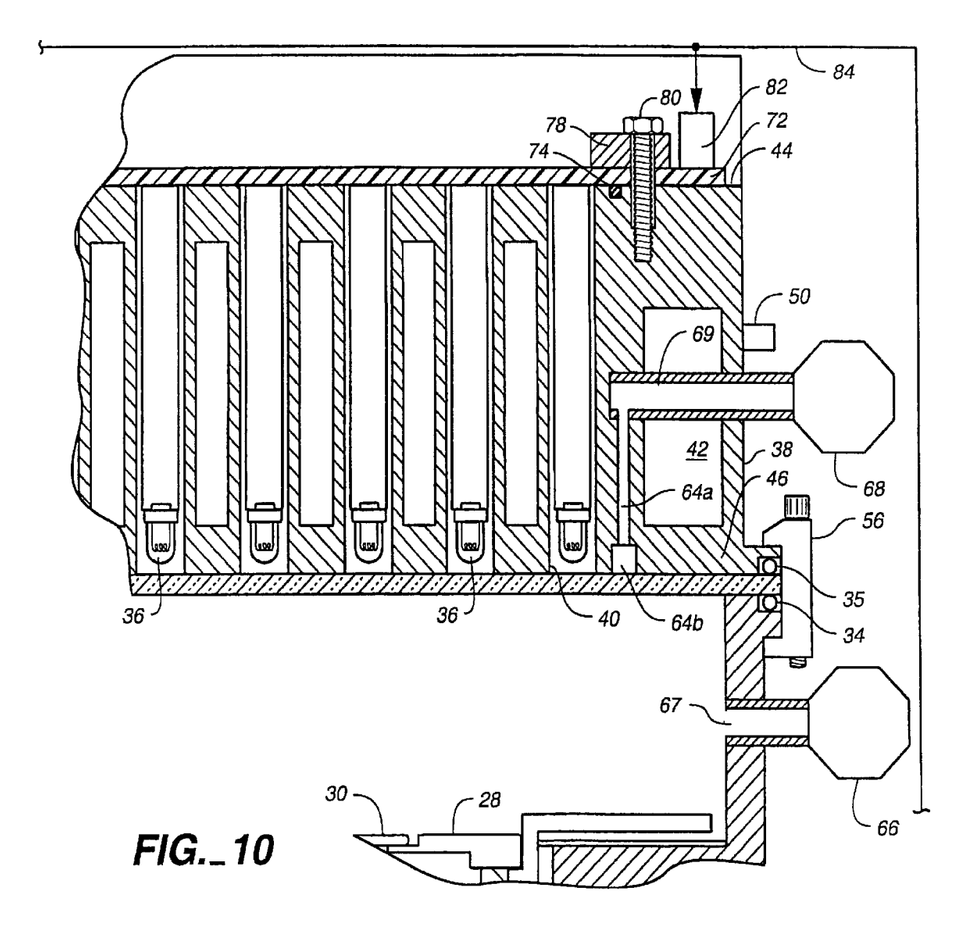
FIG. 10 is a schematic side view of a lamphead assembly without a base plate according to the invention.

As shown in FIG. 10, in another embodiment, the lamphead assembly can be modified by eliminating the base plate 70 and joining the PCB structure directly to the upper wall 44 of the lamp housing. This simplifies the design as it reduces the number of components, including the base plate 70 and the O-ring seal 76.

The design of the PCB structure may also be simplified by eliminating the socket layer. The lamps would then simply be plugged into receptacles in the base PCB layer.

The lamphead assembly can be evacuated to a pressure lower than or equal to the pressure within the process chamber. Thus, the pressure differential across the window 20, which would be present during a subatmospheric process, can be considerably reduced or eliminated. As such, the window can be made very thin. Also, the use of the evacuable lamphead eliminates the need for the above-discussed RP adapter plate. Thus, the semiconductor processing system is less complex and less expensive to construct. The use of an adapter plate also reduces the total amount of radiant energy delivered to a substrate in the process chamber, which limits the temperature ramp rate, a problem that this invention also eliminates. Common control algorithms can be used for atmospheric and RP processes previously not possible with an RP plate.

For process chambers that operate at atmospheric or above atmospheric pressures, the vacuum requirement for the lamphead is removed. In this embodiment, the socket and vacuum barrier layers may be eliminated from the PCB structure. O-ring seals are no longer required. Arc suppression features, such as o-rings or convex surfaces on the lamp electrical connector pairs, are also unnecessary.

In all methods of implementation, lamp pair current sensing may be added to the lamphead assembly. In one embodiment, current sensing is added through the use of an additional printed circuit board mounted on top of the PCB structure. This circuit board has surface mount current sensing transformers that sense current in each lamp pair. The terminal blocks and main AC power cables are connected to the current sensing board. Current travels through this board into the PCB structure where power is then supplied to the lamps as previously described. Current sensing allows lamp failure detection and reporting.

The PCB structure described above eliminates the need for an evacuable wiring collar. The system is thus simpler and less expensive to manufacture.

A vacuum lamphead assembly is further described in U.S. application Ser. No. 09/350,801, filed Jul. 9, 1999, entitled A SEMICONDUCTOR PROCESSING SYSTEM, assigned to the assignee of the present invention, the entire disclosure of which is incorporated herein by reference.

While certain exemplary embodiments have been described and shown in the accompanying drawings, it is to be understood that such embodiments are merely illustrative and not restrictive of the current invention, and that this invention is not restricted to the specific constructions and arrangements shown and described, since modifications may occur to those ordinarily skilled in the art.

What is claimed is:

1. A semiconductor processing system comprising:
   an assembly of radiant energy sources having an upper surface and a lower surface;
   a window forming a seal with the lower surface of the assembly; and
   a printed circuit board structure forming a seal with the upper surface of the assembly and configured to distribute power to the radiant energy sources;
   wherein the window and printed circuit board structure form an evacuable enclosure including the assembly.

2. The system of claim 1, further comprising:
   a base plate disposed between the printed circuit board structure and the upper surface of the assembly; and
   wherein the window, base plate and printed circuit board structure form the evacuable enclosure that includes the assembly.

3. The system of claim 2, further comprising a clamp ring to secure the printed circuit board structure to the base plate.

4. The system of claim 3, further comprising a plurality of O-ring seals to maintain vacuum integrity of the enclosure.

5. The system of claim 1, wherein the printed circuit board structure includes a vacuum barrier layer.

6. The system of claim 5, where the printed circuit board structure further includes a base printed circuit board layer having electrically-conductive traces and receptacles to distribute power to the radiant energy sources.

7. The system of claim 6, further including an electrically-insulating layer disposed between the upper surface of the assembly and the base printed circuit board layer.

8. The system of claim 6, wherein the printed circuit board structure further includes a socket layer having a plurality of receptacles configured to receive the radiant energy sources.

9. The system of claim 8 where the radiant energy sources each include a flexible base which is received within one of the receptacles of the socket layer.

10. A system for use in semiconductor processing comprising:
    an assembly of radiant energy sources located within a housing having an upper surface and a lower surface;
    a printed circuit board structure forming a seal with the upper surface of the housing and configured to distribute power to the radiant energy sources;
    a window forming a seal with the lower surface of the housing; and
    a cover forming a seal with the printed circuit board structure;
    wherein the housing, window, printed circuit board structure, and cover form an evacuable enclosure that encloses the radiant energy sources and a portion of the printed circuit board structure.

11. The system of claim 10 further including an o-ring seal located between the cover and the printed circuit board structure.

12. A system for use in semiconductor processing comprising:
    an assembly of radiant energy sources located in a housing having an upper surface and a lower surface;
    a printed circuit board forming a seal with the upper surface of the housing and configured to distribute power to the radiant energy sources;
    a window forming a seal with the lower surface of the housing; and
    wherein the housing, window and printed circuit board form an evacuable enclosure.

13. The system of claim 12, further including a socket layer having a plurality of receptacles configured to receive the radiant energy sources.

14. The system of claim 13, wherein each radiant energy source includes a flexible base having a plurality of electrical connectors configured to receive power from the printed circuit board.

15. The system of claim 14, wherein each electrical connector is disposed within a plug of the flexible base, and each socket layer receptacle is configured to receive one of the plug such that arcing is prevented.

16. The system of claim 15, wherein each plug includes a circumferential notch configured to receive an o-ring to engage an interior surface of a socket layer receptacle.

17. The system of claim 15, wherein each plug has a convex surface to engage an interior surface of a socket layer receptacle.

18. The system of claim 12, further including a base plate disposed between the printed circuit board and the upper surface of the assembly.

19. The system of claim 12, further including a plurality of O-ring seals, wherein the o-ring seals maintain vacuum integrity for the enclosure.

20. A semiconductor processing system comprising:
    a process chamber having a window and a support on which a substrate may be positioned during processing;
    an assembly of radiant energy sources located on a side of the window opposite from that of the support to direct radiant energy through the window and onto a substrate on the support;
    a printed circuit board structure located on a side of the radiant energy assembly opposite from that of the window to distribute power to the radiant energy sources; and
    wherein the window and the printed circuit board structure are sealed to the radiant energy assembly such that the radiant energy assembly is evacuable to a pressure lower than or equal to a pressure in the process chamber.

21. A system for the thermal processing of a substrate comprising:
    a process chamber having a window;
    an assembly of radiant energy sources and reflectors disposed outside of said process chamber adjacent to the window to direct radiant energy through the window onto a substrate in said process chamber; and
    a printed circuit board structure located on a side of said assembly opposite from that of the window and joined to an upper surface of said assembly to distribute power to the radiant energy sources.

22. The system of claim 21 wherein the printed circuit board structure and the window are sealed to said assembly to form an evacuable enclosure.

23. The system of claim 22 further including a first vacuum pump to evacuate said housing to a pressure equal to or lower than a pressure in the process chamber.

24. The system of claim 23 further including a second vacuum pump to evacuate said process chamber.

25. The system of claim 21 wherein the printed circuit board structure includes a vacuum barrier layer, a base printed circuit board layer and a socket layer.

26. A printed circuit board structure for delivering power to an assembly of radiant energy sources of a semiconductor processing system, comprising: a base printed circuit board layer having electrically-conductive receptacles configured to receive electrical connectors of the radiant energy sources and electrically-conductive traces to deliver power to the electrically-conductive receptacles.

27. The printed circuit board structure of claim 26 further including: a socket layer having receptacles configured to receive base portions of the radiant energy sources, the socket layer being made of an electrically-insulating material.

28. The printed circuit board structure of claim 27 wherein the base portions are flexible and house a pair of electrical connectors each of which is configured to be received within a respective one of the base printed circuit board layer receptacles.

29. The printed circuit board structure of claim 28 wherein the base portions include means for preventing arcing between the electrical connectors, and between the electrical connectors and ground, said arcing preventing means being positioned in the socket layer receptacles.

30. The printed circuit board structure of claim 29 further including a vacuum barrier layer.

\* \* \* \* \*